United States Patent
Chiang et al.

[11] Patent Number: 6,139,699
[45] Date of Patent: *Oct. 31, 2000

[54] SPUTTERING METHODS FOR DEPOSITING STRESS TUNABLE TANTALUM AND TANTALUM NITRIDE FILMS

[75] Inventors: Tony Chiang, Mountain View; Peijun Ding, San Jose; Barry L. Chin, Saratoga, all of Calif.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/863,451

[22] Filed: May 27, 1997

[51] Int. Cl.[7] .................................................. C23C 14/34
[52] U.S. Cl. ............................ 204/192.15; 204/192.12; 204/192.13; 204/192.22
[58] Field of Search .................... 204/192.12, 192.13, 204/192.15, 298.12, 192.22, 298.13; 347/203; 438/685

[56] References Cited

U.S. PATENT DOCUMENTS

| | | | |
|---|---|---|---|
| 3,607,384 | 9/1971 | Banks | 117/215 |
| 3,763,026 | 10/1973 | Cordes | 204/192 |
| 4,000,055 | 12/1976 | Kumagai | 204/192 |
| 4,036,708 | 7/1977 | Feit et al. | 204/38 A |
| 4,683,043 | 7/1987 | Melton et al. | 204/192.15 |
| 5,186,718 | 2/1993 | Tepman et al. | 29/25.01 |
| 5,236,868 | 8/1993 | Nulman | 437/190 |
| 5,464,711 | 11/1995 | Mogab et al. | 430/5 |
| 5,491,505 | 2/1996 | Suzuki et al. | 347/203 |
| 5,540,820 | 7/1996 | Terakado et al. | 204/192.15 |
| 5,643,834 | 7/1997 | Harada et al. | 437/210 |
| 5,834,374 | 11/1998 | Cabral, Jr. et al. | 438/685 |

FOREIGN PATENT DOCUMENTS

| | | | |
|---|---|---|---|
| 0346828 | 12/1989 | European Pat. Off. | G03F 1/00 |
| 0644535 | 3/1995 | European Pat. Off. | G11B 5/60 |
| WO 9704143 | 2/1997 | WIPO | C23C 16/30 |

OTHER PUBLICATIONS

S.M. Rossnagel and J. Hopwood, "Metal ion deposition from ionized mangetron sputtering discharge" J. Vac. Sci. Technol. B, vol. 12, No. 1, Jan./Feb. 1994, pp. 449–453.

S.M. Rossnagel, et al. "Thin, high atomic weight refractory film deposition for diffusion barrier, adhesion layer, and seed layer applications" J. Vac. Sci. Technol. B, 14(3), May/Jun. 1996.

Kyung–Hoon Min et al. "Comparative study of tantalum and tantalum nitrides ($Ta_2N$ and TaN) as a diffusion barrier for Cu metalization" J. Vac. Sci Technol. B 14(5), Sep./Oct. 1996.

*Primary Examiner*—Nam Nguyen
*Assistant Examiner*—Gregg Cantelmo
*Attorney, Agent, or Firm*—Shirley L. Church

[57] ABSTRACT

The present disclosure pertains to our discovery that residual stress residing in a tantalum film or tantalum nitride film can be controlled (tuned) by controlling particular process variables during film deposition. By tuning individual film stresses within a film stack, it is possible to balance stresses within the stack. Process variables of particular interest include: power to the sputtering target; process chamber pressure (i.e., the concentration of various gases and ions present in the chamber); substrate DC offset bias voltage (typically an increase in the AC applied substrate bias power); power to an ionization source (typically a coil); and temperature of the substrate upon which the film is deposited. The process chamber pressure and the substrate offset bias most significantly affect the film tensile and compressive stress components, respectively. The most advantageous tuning of a sputtered film is achieved using high density plasma sputter deposition, which provides for particular control over the ion bombardment of the depositing film surface. When the tantalum or tantalum nitride film is deposited using high density plasma sputtering, power to the ionization source can be varied for stress tuning of the film. We have been able to reduce the residual stress in tantalum or tantalum nitride films deposited using high density plasma sputtering to between about $6 \times 10^{+9}$ dynes/cm$^2$ and about $-6 \times 10^{+9}$ dynes/cm$^2$ using techniques described herein. The tantalum and tantalum nitride films can also be tuned following deposition using ion bombardment of the film surface and annealing of the deposited film.

14 Claims, 4 Drawing Sheets

SPUTTERING METHODS FOR DEPOSITING STRESS TUNABLE TANTALUM AND TANTALUM NITRIDE FILMS

BACKGROUND OF THE INVENTION

1. Field of the Invention

The present invention pertains to tantalum and tantalum nitride films which can be stress tuned to be in tension or in compression or to have a particularly low stress, and to a method of producing such films. These stress tuned films are particularly useful in semiconductor interconnect structures where they can be used to balance the stress within a stack of layers which includes a combination of barrier layers, wetting layers, and conductive layers, for example. The low stress tantalum and tantalum nitride films are particularly suited for the lining of vias and trenches having a high aspect ratio.

2. Brief Description of the Background Art

A typical process for producing a multilevel structure having feature sizes in the range of 0.5 micron ($\mu$m) or less would include: blanket deposition of a dielectric material; patterning of the dielectric material to form openings; deposition of a diffusion barrier layer and, optionally, a wetting layer to line the openings; deposition of a conductive material onto the substrate in sufficient thickness to fill the openings; and removal of excessive conductive material from the substrate surface using a chemical, mechanical, or combined chemical-mechanical polishing techniques. Future technological requirements have placed a focus on the replacement of aluminum (and aluminum alloys) by copper as the conductive material. As a result, there is an increased interest in tantalum nitride barrier layers and in tantalum barrier/wetting layers which are preferred for use in combination with copper.

Tantalum nitride barrier films, $Ta_2N$ and $TaN$, have been shown to function up to 700° C. and 750° C., respectively, without the diffusion of copper into an underlying silicon (Si) substrate. Tantalum barrier/wetting films have been shown to function at temperatures of approximately 500° C. It is advantageous in terms of processing simplicity to sputter the barrier and or wetting layers underlaying the copper. Tantalum nitride barrier layers are most commonly prepared using reactive physical sputtering, typically with magnetron cathodes, where the sputtering target is tantalum and nitrogen is introduced into the reaction chamber.

S. M. Rossnagel and J. Hopwood describe a technique which enables control of the degree of directionality in the deposition of diffusion barriers in their paper titled "Thin, high atomic weight refractory film deposition for diffusion barrier, adhesion layer, and seed layer applications" J. Vac. Sci. Technol. B 14(3), May/June 1996. In particular, the paper describes a method of depositing tantalum (Ta) which permits the deposition of the tantalum atoms on steep sidewalls of interconnect vias and trenches. The method uses conventional, non-collimated magnetron sputtering at low pressures, with improved directionality of the depositing atoms. The improved directionality is achieved by increasing the distance between the cathode and the workpiece surface (the throw) and by reducing the argon pressure during sputtering. For a film deposited with commercial cathodes (Applied Materials Endura® class; circular planar cathode with a diameter of 30 cm) and rotating magnet defined erosion paths, a throw distance of 25 cm is said to be approximately equal to an interposed collimator of aspect ratio near 1.0. In the present disclosure, use of this "long throw" technique with traditional, non-collimated magnetron sputtering at low pressures is referred to as "Gamma sputtering".

Gamma sputtering enables the deposition of thin, conformal coatings on sidewalls of a trench having an aspect ratio of 2.8:1 for 0.5 $\mu$m-wide trench features. However, we have determined that Gamma sputtered TaN films exhibit a relatively high film residual compressive stress, in the range of about $-1.0 \times 10^{+10}$ to about $-5.0 \times 10^{+10}$ dynes/cm$^2$. High film residual compressive stress, in the range described above can cause a Ta film or a tantalum nitride (e.g. $Ta_2N$ or $TaN$) film to peel off from the underlying substrate (typically silicon oxide dielectric). In the alternative, the film stress can cause feature distortion on the substrate (typically a silicon wafer) surface or even deformation of a thin wafer.

A method of reducing the residual stress in a Ta barrier/wetting film or a $Ta_2N$ or $TaN$ barrier film would be beneficial in enabling the execution of subsequent process steps without delamination of such films from trench and via sidewalls or other interconnect features. This reduces the number of particles generated, increasing device yield during production. In addition, a film having a near zero stress condition improves the reliability of the device itself.

SUMMARY OF THE INVENTION

We have discovered that the residual stress residing in a tantalum (Ta) film or a tantalum nitride ($TaN_x$, where $0<x\leq 1.5$) film can be controlled (tuned) by controlling particular process variables during deposition of the film. Process variables of particular interest for sputter applied Ta and $TaN_x$ films include the following. An increase in the power to the sputtering target (typically DC) increases the compressive stress component in the film. An increase in the process chamber pressure (i.e. the concentration of various gases and ions present in the chamber) increases the tensile stress component in the film. An increase in the substrate DC offset bias voltage (typically an increase in the applied AC as substrate bias power) increases the compressive stress component in the film. The substrate temperature during deposition of the film also affects the film residual stress. Of these variables, an increase in the process chamber pressure and an increase in the substrate offset bias most significantly affect the tensile and compressive stress components, respectively. The most advantageous tuning of a sputtered film is achieved using Ion Metal Plasma (IMP) as the film deposition method. This sputtering method provides for particular control over the ion bombardment of the depositing film surface. When it is desired to produce a film having minimal residual stress, particular care must be taken to control the amount of ion bombardment of the depositing film surface, as an excess of such ion bombardment can result in an increase in the residual compressive stress component in the deposited film.

Tantalum (Ta) films deposited using the IMP method typically exhibit a residual stress ranging from about $+1 \times 10^{+10}$ dynes/cm$^2$ (tensile stress) to about $-2 \times 10^{+}$ dynes/cm$^2$ (compressive stress), depending on the process variables described above. Tantalum nitride ($TaN_x$) films deposited using the IMP method typically can be tuned to exhibit a residual stress within the same range as that specified above with reference to Ta films. We have been able to reduce the residual stress in either the Ta or $TaN_x$ films to low values ranging from about $+1 \times 10^{+9}$ dynes/cm$^2$ to about $-2 \times 10^{+9}$ dynes/cm$^2$ using tuning techniques described herein. These film residual stress values are significantly less than those observed for traditionally sputtered films and for Gamma-sputtered films. This reduction in film residual compressive stress is particularly attributed to bombardment of the film surface by IMP-generated ions during the film deposition process. Heavy bombardment of the film surface by IMP-generated ions can increase the film residual compressive stress, so when it is desired to minimize the film compressive stress, the ion bombardment should be optimized for this purpose.

Other process variables which may be used in tuning the film stress include the spacing between the sputter target and the substrate surface to be sputter deposited; ion bombardment subsequent to film deposition; and annealing of the film during or after deposition.

BRIEF DESCRIPTION OF THE DRAWINGS

FIG. 4 shows the resistivity and the structure of the tantalum nitride compound, which is in conformance with the nitrogen content of the compound.

DETAILED DESCRIPTION OF THE PREFERRED EMBODIMENTS

Figure 1:
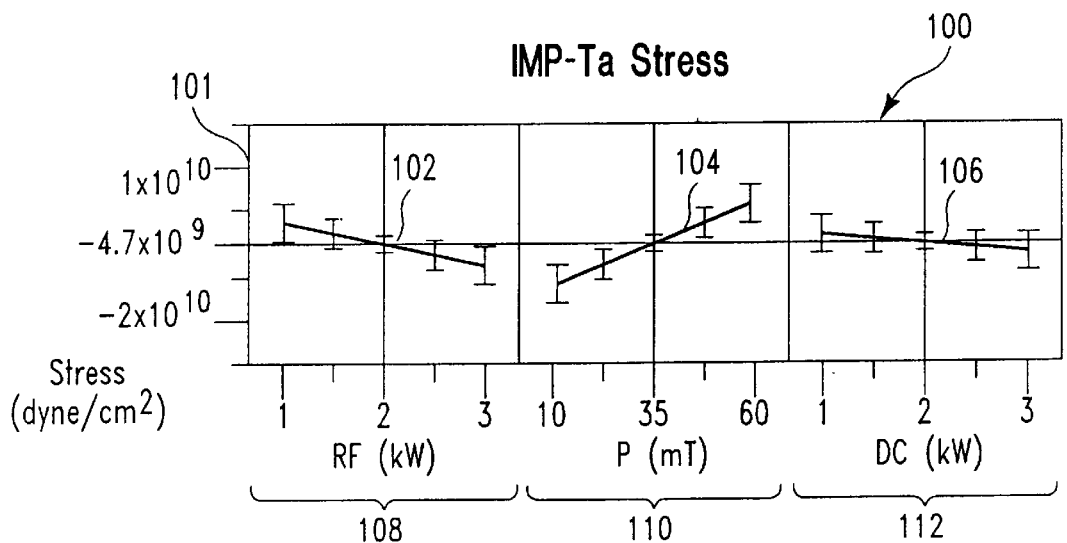
FIG. 1 is a graph showing the residual stress in an IMP deposited Ta film as a function of DC power to the Ta target, RF power to the IMP ionization coil, and the pressure in the process chamber.

The present invention pertains to stress tunable tantalum and tantalum nitride films and to a method of producing such films. In particular, applicants have discovered that residual film stress can be tuned by controlling particular process variables such as process chamber pressure, DC offset bias voltage, power to the sputtering target and substrate temperature during film deposition. When IMP sputtering is used, a variation in the power to the ionization coil can be used for tuning. Ion bombardment of the depositing film surface is particularly useful in controlling residual film stress.

I. Definitions

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to a "plasma" includes a gas or gas reactants activated by an RF glow discharge, and reference to "copper" includes alloys thereof.

Film stress values were measured using a Tencor® Flexus FLX 3200 machine available from Tencor Corporation, Mountain View, Calif.

Specific terminology of particular importance to the description of the present invention is defined below.

The term "aspect ratio" refers to the ratio of the height dimension to the width dimension of particular openings into which an electrical contact is to be placed. For example, a via opening which typically extends in a tubular form through multiple layers has a height and a diameter, and the aspect ratio would be the height of the tubular divided by the diameter. The aspect ratio of a trench would be the height of the trench divided by the minimal travel width of the trench at its base.

The term "completely filled" refers to the characteristic af a feature such as a trench or via which is filled with a conductive material, wherein there is essentially no void space present within the portion of the feature filled with conductive material.

The term "copper" refers to copper and alloys thereof, wherein the copper content of the alloy is at least 80 atomic % copper. The alloy may comprise more than two elemental components.

The term "feature" refers to contacts, vias, trenches, and other structures which make up the topography of the substrate surface.

The term "Gamma or (γ) sputtered copper" refers to the "long throw" sputtering technique described in the paper by S. M. Rossnagel and J. Hopwood, which was discussed previously herein. Typically the distance between the substrate and the target is about the diameter of the substrate or greater; and, preferably, the process gas pressure is sufficiently low that the mean free path for collision within the process gas is greater than the distance between the target and the substrate.

The term "ion metal plasma" or "IMP" refers to sputter deposition, preferably magnetron sputter deposition (where a magnet array is placed behind the target). A high density, inductively coupled RF plasma is positioned between the sputtering cathode and the substrate support electrode, whereby at least a portion of the sputtered emission is in the form of ions at the time it reaches the substrate surface.

The term "IMP sputtered tantalum" refers to tantalum which was sputtered using the IMP sputter deposition method.

The term "IMP sputtered tantalum nitride" refers to tantalum nitride which was sputtered using the IMP sputter deposition method.

The term "reactive IMP sputtered tantalum nitride" refers to ion-deposition sputtering wherein nitrogen gas is supplied during the sputtering of tantalum, to react with the ionized tantalum, producing an ion-deposition sputtered tantalum nitride-comprising compound.

The term "stress tuned" refers to a TaN$_x$ or Ta film which has been treated during processing to adjust the residual stress within the deposited film to fall within a particular desired range. For example, at times it is desired to use the TaN$_x$ or Ta film to balance the overall stress within a stack of layers, so the film may be tuned to be in compression or tension. At other times it may be desired to reduce the stress in the film to be as near to zero as possible.

The term "traditional sputtering" refers to a method of forming a film layer on a substrate wherein a target is sputtered and the material sputtered from the target passes between the target and the substrate to form a film layer on the substrate, and no means is provided to ionize a substantial portion of the target material sputtered from the target before it reaches the substrate. One apparatus configured to provide traditional sputtering is disclosed in U.S. Pat. No. 5,320,728, the disclosure of which is incorporated herein by reference. In such a traditional sputtering configuration, the percentage of target material which is ionized is less than 10%, more typically less than 1%, of that sputtered from the target.

II. An Apparatus For Practicing the Invention

A process system in which the method of the present invention may be carried out is the Applied Materials, Inc. (Santa Clara, Calif.) Endura® Integrated Processing System. The system is shown and described in U.S. Pat. No. 5,186,718, the disclosure of which is hereby incorporated by reference.

The traditional sputtering process is well known in the art. The Gamma sputtering method is described in detail by S. M. Rossnagel and J. Hopwood in their paper titled "Thin, high atomic weight refractory film deposition for diffusion barrier, adhesion layer, and seed layer applications", as referenced above. The IMP sputtering method is also described by S. M. Rossnagel and J. Hopwood in their paper "Metal ion deposition from ionized magnetron sputtering discharge, J. Vac. Sci. Technol. B, Vol. 12, No. 1 (January/February 1994).

III. The Structure of the Tantalum and Tantalum Nitride Films

We have been able to create a copper filled trench or via, which is completely filled, at a feature size of about 0.4 $\mu$ and an aspect ratio of greater than 1:1 (up to about 3:1 presently). To facilitate the use of a copper fill, the trench or via (constructed in a silicon oxide surface layer) was lined with a reactive IMP sputtered TaN$_x$ barrier layer, followed by a Ta barrier/wetting layer, to create a bilayer over the oxide surface layer. The copper fill layer was applied using a sputtering technique in the manner described in applicants' co-pending U.S. application Ser. No. 08/855,059, filed May 13, 1997, pending.

To ensure the overall dimensional stability of the structure, we investigated various factors which affect the residual film stress in a TaN$_x$ barrier layer and in a Ta layer (which can serve as a barrier layer, a wetting layer, or both, depending on the application).

One skilled in the art can envision a combination of a number of different layers underlaying the copper fill material. Whatever the combination of layers, they provide a stack of layers; and tuning the stress of individual layers within the stack can provide a more stress balanced and dimensionally stable stack. Although the preferred embodiment described above is for the lining of trenches and vias, one skilled in the art will appreciate that the stress tuned TaN$_x$ and Ta films described herein have general application in semiconductor interconnect structures. The method of controlling and reducing the residual film stress in tantalum nitride and tantalum films can be used to advantage in any structure in which a layer of such a film is present. The concept of tuning the residual stress in a sputter-deposited film comprising at least one metal element has broad applicability.

IV. The Method of Tuning Residual Stress in Tantalum and Tantalum Nitride Films The preferred embodiments described herein were produced in an Endura® Integrated Processing System available from Applied Materials of Santa Clara, Calif. The physical vapor deposition (sputtering in this case) process chamber is capable of processing an 8 inch (200 mm) diameter silicon wafer. The substrate was a silicon wafer having a silicon oxide surface coating with trenches in the surface of the silicon oxide. Sputtering was carried out using a tantalum target cathode having approximately a 35.3 cm (14 in.) diameter, and DC power was applied to this cathode over a range from about 1 kW to about 18 kW. The substrate was placed at a distance of about 25 cm (9.8 in.) from the tantalum target cathode in the case of gamma sputtering, and at a distance of about 14 cm (5.5 in.) from the cathode in the case of IMP sputtering. During IMP sputtering, an AC bias power ranging from about 0 W to about 400 W was applied to the substrate, to produce a substrate offset bias ranging from about 0 V to about −100 V. The substrate offset bias attracts ions from the plasma to the substrate.

Example One

When Gamma-sputtered tantalum film was produced, the film was sputtered using conventional (traditional) magnetron sputtering, with rotating magnet-defined erosion paths (for better uniformity and cathode utilization). Two hundred (200) mm sample surfaces were sputter-deposited at a sample surface temperature of about 25° C., in argon, at pressures of about 1.5 mT or less. The cathode to sample or "throw" distance was typically about 25 cm. The DC power to the tantalum target was approximately 4 kW. No substrate offset bias was used. Under these conditions, the residual film stress of the tantalum film was about −1.5×10$^{+10}$ dynes/cm$^2$.

Example Two

When IMP-sputtered tantalum film was produced, a high density, inductively coupled RF plasma was generated in the region between the target cathode and the substrate by applying RF power to a coil (having from 1 to 3 turns) over a range from about 400 kHz to about 13.56 MHz (preferably about 2 MHz). Two hundred (200) mm sample surfaces were IMP sputter-deposited at a sample surface temperature of about 25° C., in argon, at pressures ranging from about 10 mT to about 60 mT. The distance from the cathode to the sample was typically about 14 cm. The DC power to the tantalum target was adjusted over a range from about 1 kW to about 8 kW (preferably about 1 kW to about 3 kW). The wattage to the RF power coil was adjusted over a range from about 1.0 kW to about 5 kW (preferably about 1.0 kW to about 3 kW). An AC bias power ranging from about 0 W to about 500 W was used. FIG. 1 shows a graph 100 of the residual film stress 101 of the tantalum film in dynes/cm$^2$, as a function of the RF power 108 to the ionization coil, as illustrated by the curve numbered 102; the pressure 110 in the sputtering chamber, as illustrated by the curve numbered 104; and the DC power 112 to the sputtering target (cathode), as illustrated by the curve numbered 106.

As indicated in graph 100, the residual stress in the deposited Ta film can be tuned over a wide range, for example (but not by way of limitation), from about $1.0 \times 10^{+10}$ dynes/cm$^2$ to about $-2 \times 10^{+10}$ dynes/cm$^2$, and can be set at a low stress nominal value, for example, between about $6 \times 10^{+9}$ dynes/cm$^2$ and about $-6 \times 10^{+9}$ dynes/cm$^2$, a range over which the residual stress can approach zero. At a residual stress of about $-6 \times 10^{+9}$ dynes/cm$^2$, by way of example, the IMP sputtered film residual compressive stress is a factor of three lower than the residual compressive stress of a typical gamma-sputtered Ta film. The process variables which affect film residual stress can be optimized to produce the desired residual film stress in Ta films.

Figures 2A, 2B:
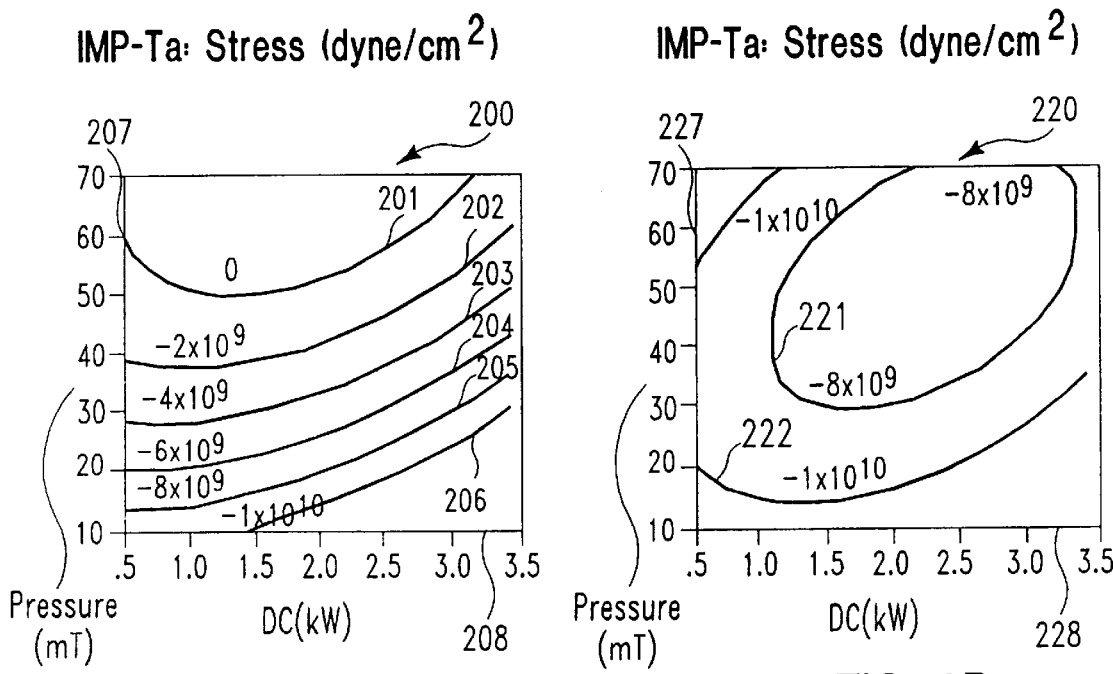
FIG. 2A is a contour plot showing the IMP deposited Ta film residual stress in dynes/cm$^2$ as a function of the DC power to the Ta target and the process chamber pressure, when the RF power to the ionization coil is 1 kW.
FIG. 2B is a contour plot showing the residual stress in an IMP deposited Ta film as a function of the same variables illustrated in FIG. 2A, when the RF power to the ionization coil is 3 kW.

FIGS. 2A and 2B show the effect of an increase in the RF power to the IMP ionization coil, which is directly related to the amount of ion bombardment at the tantalum film surface. FIG. 2A, graph 200, shows the Ta residual film stress in curves 201 through 206, when the power to the ionization coil is 1 kW, as a function of process chamber argon pressure 207 and the DC power to the tantalum target 208. FIG. 2B, graph 220, shows the Ta residual film stress interior of ellipses 221 and 222, when the power to the ionization coil is 3 kW, as a function of process chamber argon pressure 227 and the DC power to the tantalum target 228.

These curves show that, with the other process values held constant, an increase in RF power to the ionization coil from 1 kW to 3 kW results in an increase in the film residual compressive stress. Even so, under all of the process conditions shown, the residual film stress for the IMP-sputtered tantalum is less than that of a Gamma-sputtered tantalum film. We have concluded, then, that there is an optimum amount of ion bombardment of a tantalum film surface to produce a Ta film having only minor residual stress (whether compressive or in tension). Process pressure appears to have the greatest effect of the variables tested. It is believed that an increase in the process pressure leads to an increase in ionization within the process chamber, which leads to increased ion bombardment of the depositing film surface.

Example Three

Figure 3:
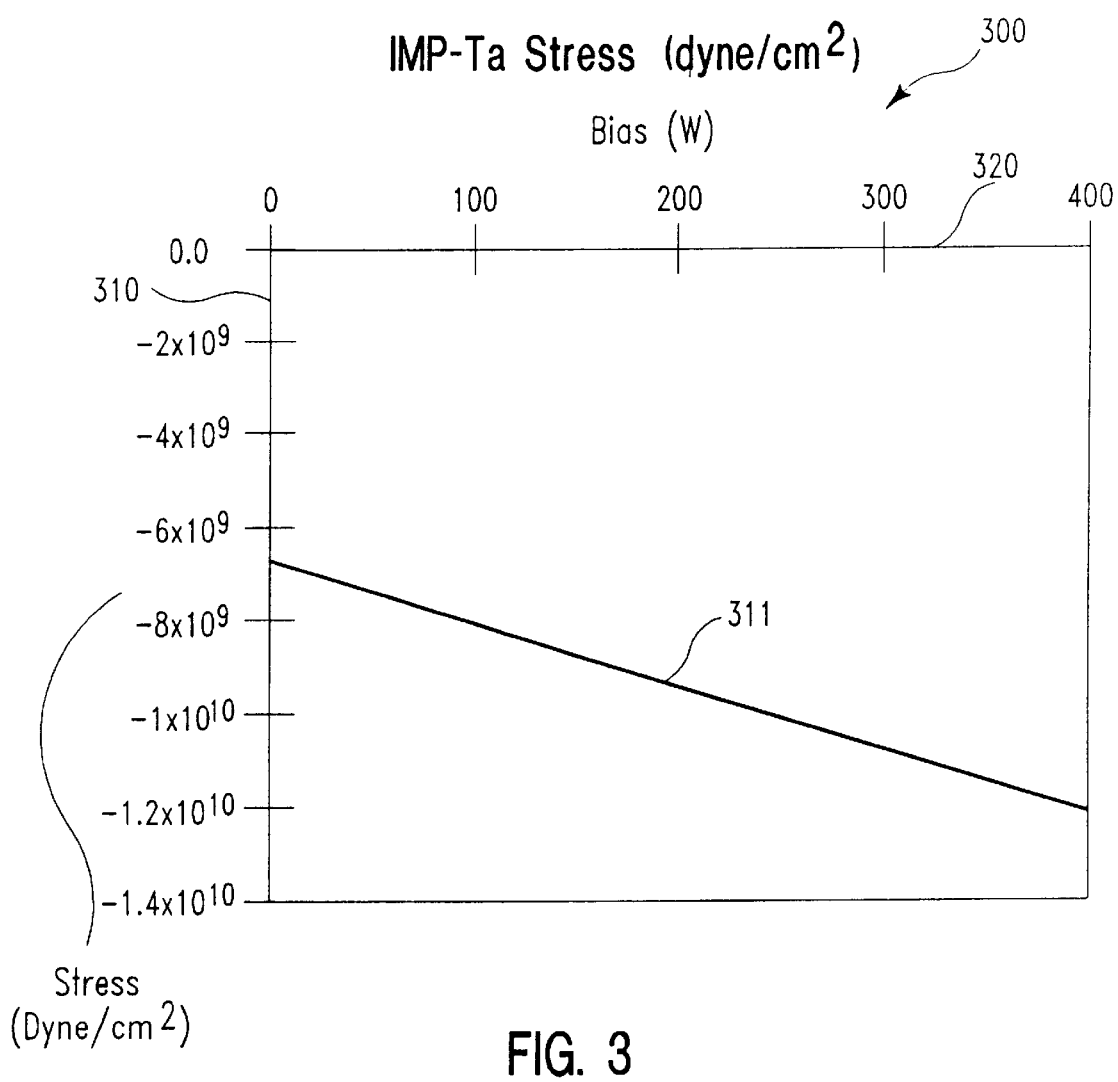
FIG. 3 is a graph showing the residual stress in an IMP deposited Ta film as a function of the substrate offset bias, and in particular as a function of the AC bias power (typically the AC power is coupled to the substrate through the substrate heater which is in electrical contact with the substrate).

The effect of the increase in ion bombardment of a depositing film surface, which can be achieved by increasing the DC offset bias voltage of the substrate onto which the film is deposited, is illustrated in FIG. 3. Graph 300 shows the residual stress 311 in dynes/cm$^2$ 310 as a function of the AC bias power 320 in Watts. The corresponding substrate DC offset bias voltage ranges from about 0 V to about $-150$ V.

Example Four

Figure 4:
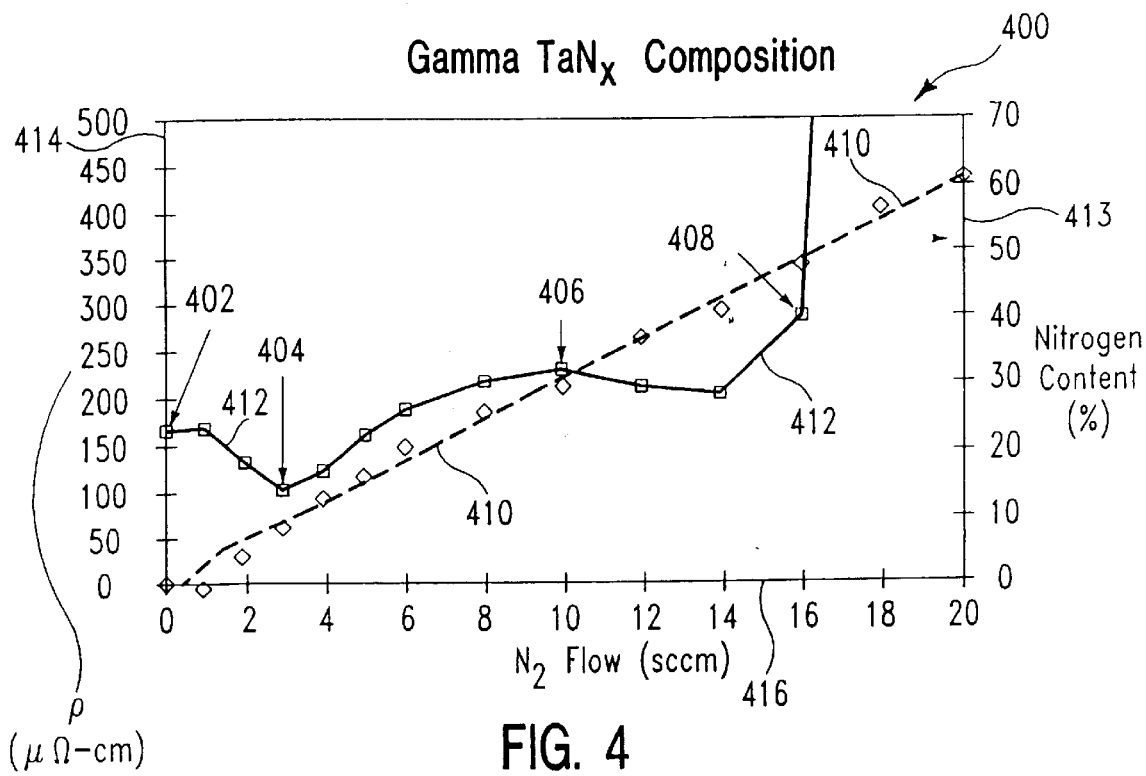
FIG. 4 is a graph showing the chemical composition of a Gamma-sputtered tantalum nitride film, as a function of the nitrogen gas flow rate to the sputtering process chamber. In addition.
Figure 5:
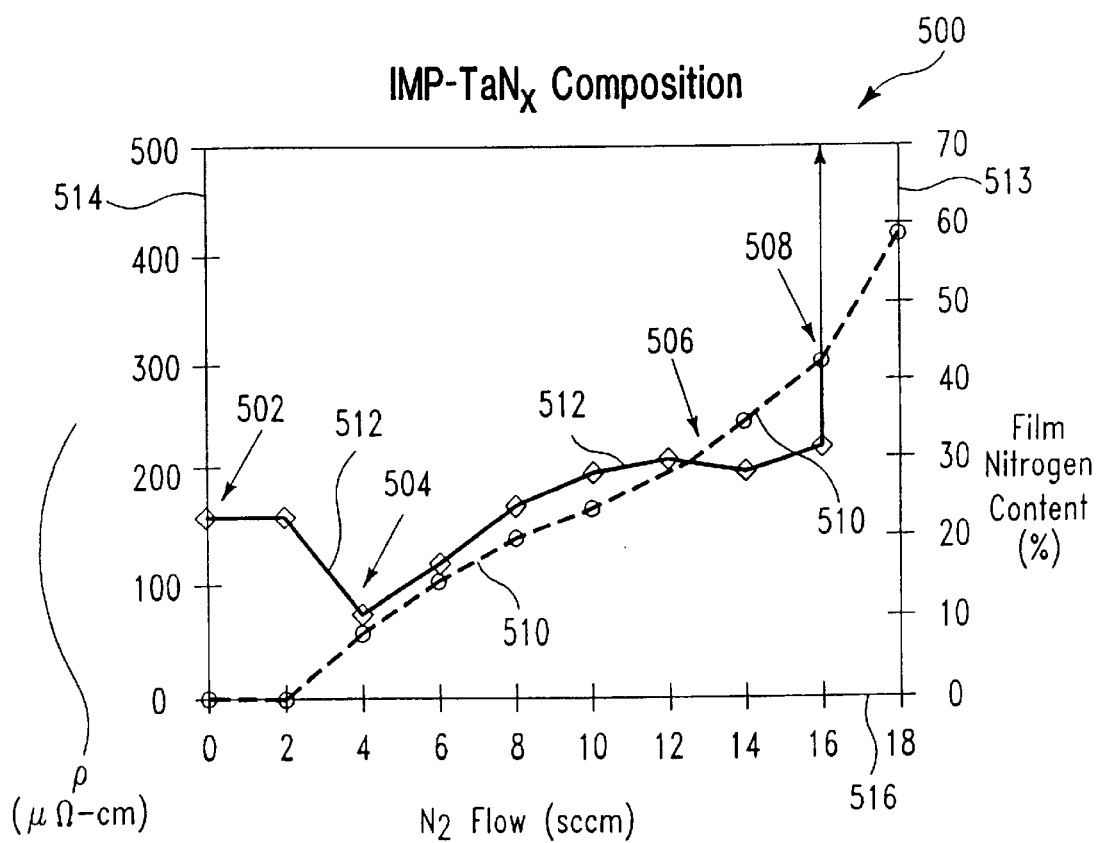
FIG. 5 is a graph showing the film composition of a reactive IMP-deposited tantalum nitride film, as a function of the nitrogen gas flow rate to the process chamber. Again, the resistivity of the film is indicative of the various film structures created as the nitrogen content of the film is increased.

When tantalum nitride films are produced, the structure of the tantalum nitride depends on the amount of nitrogen in the tantalum nitride compound (film). FIGS. 4 and 5 show the chemical composition and resistivity of tantalum nitride films produced using Gamma sputtering and IMP sputtering techniques, respectively. The chemical composition (atomic nitrogen content) of the film is shown as a function of the nitrogen gas flow rate to the process chamber in which the TaN$_x$ film is produced.

FIG. 4, graph 400, shows the nitrogen content 410 of the Gamma-sputtered tantalum nitride film in atomic % 413, as a function of the nitrogen flow rate 416 in sccm to the process vessel. A two hundred (200) mm diameter sample surface was Gamma sputter-deposited at a sample surface temperature of about 25° C., in an argon/nitrogen atmosphere, at a pressure of about 1.5 mT, where the Argon gas feed was about 15 sccm and the nitrogen flow rate 416 was as shown on graph 400. The "throw" distance between the tantalum target and the sample surface was approximately 250 mm. The DC power to the tantalum target was about 4 kW.

In addition, graph 400 shows the resistivity 412 in $\mu\Omega$-cm 414 of the tantalum nitride film as the nitrogen content 413 increases. The resistivity corresponds with the change in the tantalum nitride structure, as indicated on Graph 400, where 402 represents β-Ta; 404 represents bcc—Ta(N); 406 represents amorphous TaN$_x$; and 408 represents nanocrystalline fcc—TaN$_x$ (x≈1).

FIG. 4 shows that when the atomic nitrogen content exceeds about 45% to about 50%, the resistivity of the TaN$_x$ film increases drastically (to above 1,000 $\mu\Omega$-cm).

Figure 6:
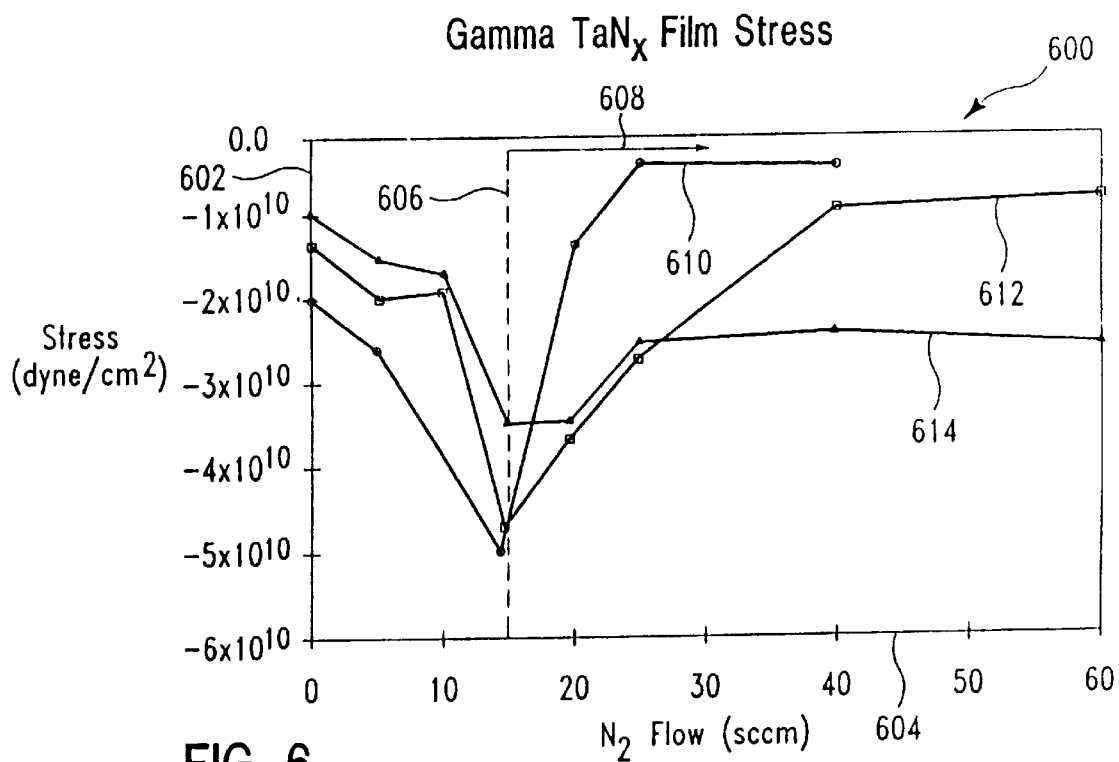
FIG. 6 is a graph showing the residual film stress for Gamma-sputtered tantalum nitride film as a function of the nitrogen gas flow rate to the sputtering process chamber and as a function of the temperature at which the film is deposited.

FIG. 6, graph 600, shows the residual film stress in dynes/cm$^2$ 602 of a Gamma sputtered TaN$_x$ film, as a function of the nitrogen flow rate to the process chamber in sccm 604, and as a function of the substrate temperature at the time of film deposition, when the other process variables are held at the values described with reference to FIG. 4.

Curve 610 represents the TaN$_x$ film Gamma sputtered at a substrate temperature of about 25° C.; Curve 612 represents the TaN$_x$ film Gamma sputtered at a substrate temperature of about 250° C., and Curve 614 represents the TaN$_x$ film Gamma sputtered at a substrate temperature of about 450° C.

Line 606 constructed at a nitrogen flow rate 604 of about 16 sccm, represents the atomic nitrogen content in excess of which the resistivity of the TaN$_x$ film increases drastically (as illustrated in FIG. 4 for a nitrogen flow rate of 16 sccm). Thus, the gamma-sputtered TaN$_x$ films having reduced residual compressive stress (in the direction of arrow 608) occur at nitrogen contents at which the resistivity of the film is unacceptably high (greater than about 1,000 $\mu\Omega$-cm). Looking at the residual film stress of TaN$_x$ films having a resistivity lower than about 1,000 $\mu\Omega$-cm, it is evident that residual film stress can be reduced by increasing the substrate temperature at the time of film deposition. This is in contrast with TaN$_x$ films having a resistivity higher than about 1,000 $\mu\Omega$-cm, where the residual film stress increases when the substrate temperature is higher during film deposition. Considering this unexpected result, for Gamma sputtered films having a nitrogen content below about 45%–50%, it is preferable to deposit the TaN$_x$ film at a substrate temperature of at least about 250° C., and more preferably at a substrate temperature of at least about 350° C.

Example Five

FIG. 5 graph 500 shows the nitrogen content 510 of the reactive IMP-sputtered TaN$_x$ film in atomic % 513, as a function of the nitrogen flow rate in sccm 516 to the process chamber. A two hundred (200) mm diameter sample (substrate) surface was reactive IMP sputter-deposited at a sample surface temperature of about 25° C., in an argon/nitrogen atmosphere, at a pressure of about 40 mT, where Argon gas feed was about 95 sccm (80 sccm to the process chamber feed and 15 sccm to the heat exchange surface) and the nitrogen flow rate 516 was as shown on graph 500. The DC power to the tantalum target was about 2 kW. The RF power to the IMP induction coil was about 1.5 kW. No offset bias of the substrate was used.

In addition, graph 500 shows the resistivity 512 in $\mu\Omega$-cm 514 of the IMP sputtered TaN$_x$ film as the atomic nitrogen content 513 increases. The resistivity corresponds with the change in the tantalum nitride structure, as indicated on Graph 500, where 502 represents β-Ta; 504 represents bcc—Ta(N); 506 represents amorphous TaN$_x$; and 508 represents nanocrystalline fcc—TaN$_x$ (x≈1).

FIG. 5 also shows that when the atomic nitrogen content exceeds about 45%, the resistivity of the TaN$_x$ film increases drastically (to above 1,000 μ Ω-cm).

Figure 7:
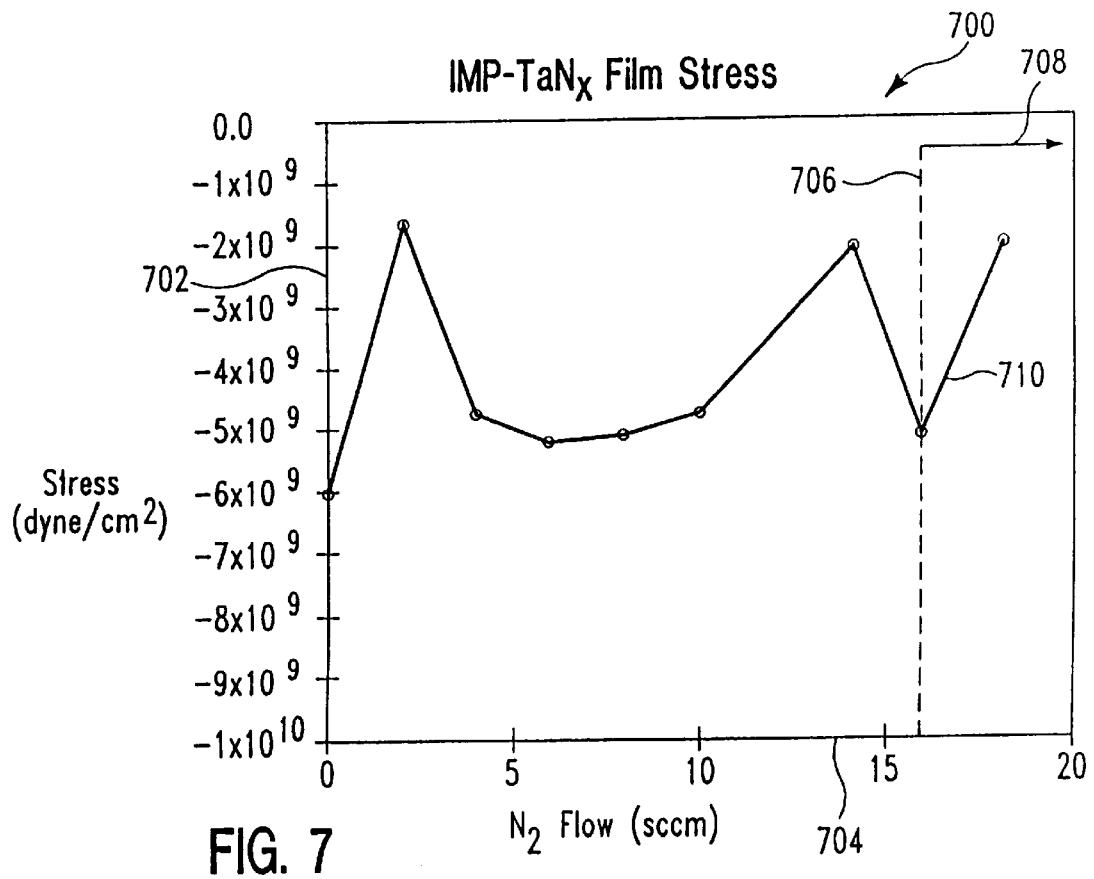
FIG. 7 is a graph showing the residual film stress for reactive IMP sputtered tantalum nitride film as a function of the nitrogen gas flow rate to the sputtering process chamber.

FIG. 7, graph 700, shows the residual film stress in dynes/cm$^2$ 702 of an IMP sputtered TaN$_x$ film, as a function of the nitrogen flow rate to the process chamber in sccm 704, for deposition on a substrate at a temperature of about 25° C., when the other process variables are held at the values described with reference to FIG. 5.

Line 706, constructed at a nitrogen flow rate 704 of about 14–16 sccm, represents the atomic nitrogen content in excess of which the resistivity of the TaN$_x$ film increases drastically (as illustrated in FIG. 5). We discovered that for IMP sputtered TaN$_x$ films, in contrast with the gamma sputtered films, it is possible to produce a film having reduced residual stress at the lower nitrogen contents, where an acceptable resistivity can be obtained. Further, the IMP sputtered TaN$_x$ film residual stress appears to remain relatively unaffected by an increase in the nitrogen content over the nitrogen content range represented by the nitrogen flow rates illustrated in FIG. 7 (up to about 60 atomic % nitrogen, based on FIG. 5).

By depositing the tantalum nitride film using the IMP sputtering method which provides increased bombardment of the depositing film surface (over that obtained by the Gamma sputtering method), it is possible to produce a TaN$_x$ film having both an acceptable resistivity and reduced residual film stress. This is because the IMP sputtered TaN$_x$ film stress remains relatively unchanged with increasing nitrogen content (in comparison with gamma sputtered TaN$_x$ film stress which is strongly dependent on the nitrogen content of the film in the region where the film resistivity is acceptable).

The above described preferred embodiments are not intended to limit the scope of the present invention, as one skilled in the art can, in view of the present disclosure expand such embodiments to correspond with the subject matter of the invention claimed below.

We claim:

1. A method of sputter depositing a tantalum film having a desired nominal residual film stress by tuning at least two process variables which have an opposite effect on said residual film stress, to produce said tantalum film having said desired nominal residual film stress.

2. The method of claim 1, wherein said tantalum film is deposited using high density plasma sputtering.

3. The method of claim 1, wherein said tantalum film comprises body centered cubic tantalum.

4. The method of claim 1, wherein a crystalline structure of said tantalum film is β tantalum.

5. The method of claim 1, wherein an increase in a nominal value of one of said at least two process variables increases said deposited film residual tensile stress, while an increase in a nominal value of another of said at least two process variables increases said deposited film residual compressive stress.

6. A method of sputter depositing a tantalum film having a desired nominal residual film stress by tuning a combination of film deposition process variables selected from the group consisting of process chamber pressure, substrate DC offset bias voltage, power to a sputtering target, power to an ionization source, and substrate temperature.

7. The method of claim 6, wherein said film is deposited by tuning said process variables to provide a nominal residual film stress ranging between about 1×10$^{+10}$ dynes/cm$^2$ and about −2×10$^{+10}$ dynes/cm$^2$.

8. A method of sputter depositing a tantalum nitride film having a desired nominal residual film stress by tuning at least two process variables which have an opposite effect on said residual film stress, to produce said tantalum nitride film having said desired nominal residual film stress.

9. The method of claim 8, wherein said tantalum nitride film is deposited using reactive high density plasma sputtering.

10. The method of claim 9, wherein said tantalum nitride film comprises at least 30 atomic % nitrogen.

11. The method of claim 10, wherein said nitrogen content is less than 60 atomic % nitrogen.

12. The method of claim 8, wherein an increase in a nominal value of one of said at least two process variables increases said deposited film residual tensile stress, while an increase in a nominal value of another of said at least two process variables increases said deposited film residual compressive stress.

13. A method of sputter depositing a tantalum nitride film having a desired nominal residual film stress by tuning a combination of film deposition process variables selected from the group consisting of process chamber pressure, substrate DC offset bias voltage, power to a sputtering target, power to an ionization source, and substrate temperature.

14. The method of claim 13, wherein said film is deposited by tuning said process variables to provide a nominal residual film stress ranging between about 1×10$^{+10}$ dynes/cm$^2$ and about −2×10$^{+10}$ dynes/cm$^2$.

* * * * *